US007110527B2

United States Patent
Skradde et al.

(10) Patent No.: US 7,110,527 B2
(45) Date of Patent: Sep. 19, 2006

(54) HOUSING FOR TELECOMMUNICATIONS EQUIPMENT

(75) Inventors: Steven W. Skradde, Lino Lakes, MN (US); Robin L. Berg, Jr., Shakopee, MN (US); Timothy J. Kjolsing, Chaska, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 655 days.

(21) Appl. No.: 10/005,207

(22) Filed: Dec. 4, 2001

(65) Prior Publication Data

US 2003/0103335 A1 Jun. 5, 2003

(51) Int. Cl.
*H04M 5/00* (2006.01)
(52) U.S. Cl. .................. 379/325; 379/326; 379/327; 379/328; 379/329; 379/330
(58) Field of Classification Search ............. D13/133, D13/152; D14/357; 379/325, 326, 327, 379/328, 329, 330; 385/53, 88, 92, 153
See application file for complete search history.

(56) References Cited

U.S. PATENT DOCUMENTS 4,595,839 A * 6/1986 Braun et al. ............... 250/551
6,201,920 B1 * 3/2001 Noble et al. ............... 385/134
D449,300 S * 10/2001 Bentz et al. ............... D14/357
D451,479 S * 12/2001 Bateson et al. ............ D13/152
6,364,535 B1 * 4/2002 Coffey ......................... 385/53

OTHER PUBLICATIONS

U.S. Appl. No. 09/873,763, filed on Jun. 4, 2001.
Homeworx HWX Transmission System; HWX 1310/1550 nm Equipment Shelf; ADC Broadband Communications.
DS3/T3 Fiber Optic Links, Versitron; DS3/T3 Point-to-Point Fiber Optic Link.
Extend Broadband E3, T3 & STS-1 Service Over fiber-Quickly and Economically; Optical/Electrical Converter Module for the BCS II; Telect, Inc.; www. telect.com; Oct. 2000.
BCS II Optical-Electrical Converter Module; www.telect.com.
Telect, Inc., Vector Stand-Alone Modules, http://www.telect.com, 3 pgs. (2001).
Telect, Inc., Vector Chassis 32-Position, User Manual, http://www.telect.com, 24 pgs. (2001).
Telect, Inc., "Vector™ optical transport system applications & specifications," 2 pgs., (2001).

* cited by examiner

*Primary Examiner*—Bing Q. Bui
(74) *Attorney, Agent, or Firm*—Merchant & Gould P.C.

(57) ABSTRACT

A telecommunications equipment mounting assembly is disclosed herein. The assembly includes a housing adapted for holding telecommunications equipment such as an optical-to-electrical and electrical-to-optical converter modules. The telecommunications equipment mounting assembly also includes an adapter plate removably connected to the housing. The adapted plate includes structure for managing both fiber optic and copper cable.

13 Claims, 11 Drawing Sheets

HOUSING FOR TELECOMMUNICATIONS EQUIPMENT

FIELD OF THE INVENTION

The present invention relates generally to telecommunications equipment. More specifically, the present invention relates to structures for mounting telecommunications equipment such as electrical-to-optical and optical-to-electrical signal converters.

BACKGROUND

Telecommunications equipment for converting electrical signals to optical and for converting optical signals to electrical are useful in various applications. For example, electrical to optical and optical to electrical converters are useful in applications were signals arrive in the electrical media but must be distributed over distances greater than is possible over a continuous electrical conductor. Signals may only be transferred relatively limited distances on electrical conductors due to attenuation before repeaters must be introduced to reconstruct the signal. However, fiber conductors can carry a signal over distances many times greater than electrical conductors. Therefore, applying an electrical to optical conversion for a signal prior to distribution and then optical to electrical conversion near the destination eliminates the need for the interposed repeater circuits. Also, employing one large diameter fiber optic cable reduces the clutter that would result from the many coaxial cables that would otherwise be necessary.

Telecommunications equipment such as electrical-to-optical and optical-to-electrical converters generate electromagnetic interference and are sensitive to external sources of electromagnetic interference. Housings/chassis are used to shield signal converters from external electromagnetic interference and to prevent interference generated by the converters from affecting adjacent equipment.

SUMMARY

One invention disclosed herein relates to a stand-alone housing for enclosing telecommunications equipment such as an electrical-to-optical/optical-to-electrical signal converter. The stand-alone housing preferably includes structure for managing fiber optic cables and coaxial cables.

Another invention disclosed herein relates to a stand-alone housing for enclosing telecommunications equipment. A removable adapter plate can be connected to the housing for allowing the housing to be connected to a structure such as a wall.

Another invention disclosed herein relates to a manufacturing system including electrical-to-optical/optical-to-electrical converter modules that are configured to fit within both stand-alone housings as well as multi-module housings.

A variety of advantages of the inventions will be set forth in part in the description that follows, and in part will be apparent from the description or may be learned by practicing the inventions. It is to be understood that both the foregoing general description and the following detailed description are exemplary and explanatory only and are not restrictive of the inventions as claimed.

BRIEF DESCRIPTION OF THE DRAWINGS

The accompanying drawings, which are incorporated in and constitute a part of the specification, illustrate several aspects of the inventions and together with the description, serve to explain the principles of the inventions. A brief description of the drawings is as follows.

While the inventions disclosed herein are amiable to various modifications and alternative forms, specific embodiments have been shown by way of example in the drawings and will be described in detail below. It is to be understood, however, that the intention is not to limit the inventions to the particular embodiments described. On the contrary, the intention is to cover all modifications, equivalents and alternatives falling within the scope of the inventions as defined by the appended claims.

DETAILED DESCRIPTION

In the following detailed description, references are made to the accompanying drawings that depict various embodiments in which the inventions may be practiced. It is to be understood that other embodiments may be utilized, and that structural and functional changes may be made without departing from the scope of the present inventions. Further, each of the features disclosed herein can be considered stand-alone inventive features or features that have inventive aspects when considered a combination with one another.

FIGS. 1–5 illustrate a telecommunications equipment mounting assembly 20 that is an embodiment of the present invention. The mounting assembly 20 includes a housing 22 (i.e., an enclosure) in which an electrical-to-optical/optical-to-electrical converter module 24 is removably mounted. The mounting assembly 20 also includes an adapter plate 26 removably fastened to the housing 22. The adapter plate 26 includes structure for allowing the mounting assembly 20 to be fastened to a wall or other structure. For example, the adapter plate 26 is shown including three fastener openings 28 (e.g., slots, holes, etc.) adapted for receiving fasteners such as bolts, screws or nails. The adapter plate 26 also includes structure for providing enhanced cable management. For example, the adapter plate 26 is shown including a fiber spool 30 for storing excess fiber cable, and tie-down structures such as lances 32, posts, brackets, bars or other structures for tying down electrical cables or electrical wire.

I. General Housing Description

Figure 1:
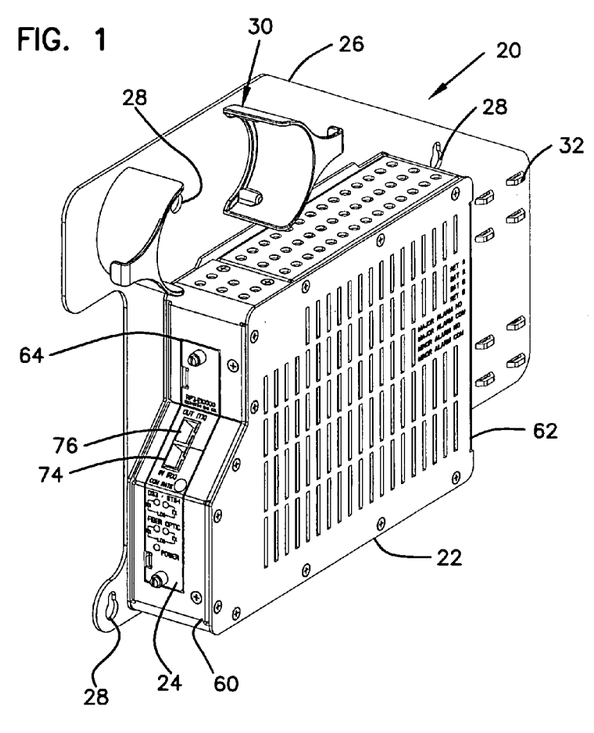
FIG. 1 is a perspective view of a telecommunications equipment mounting assembly that is an embodiment of the present invention.
Figure 2:
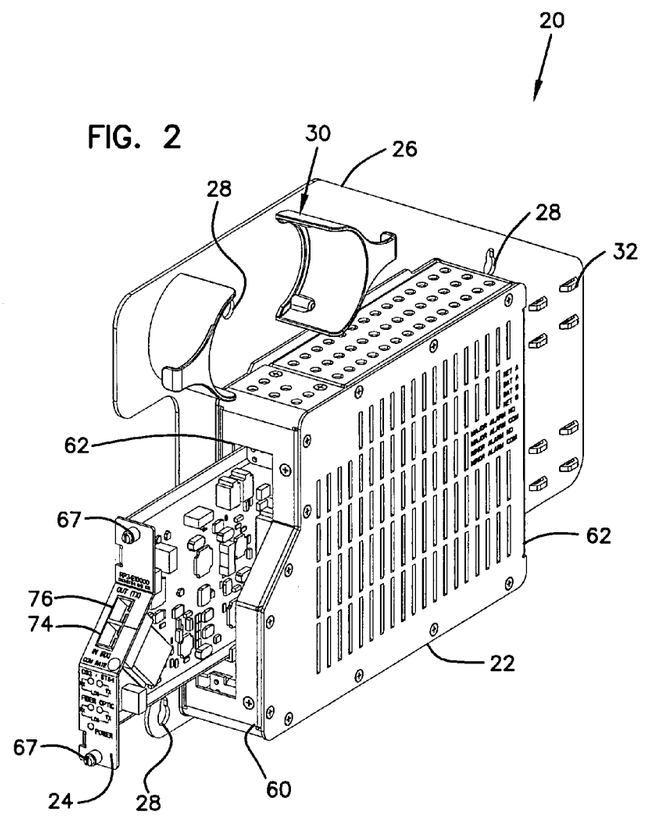
FIG. 2 illustrates the mounting assembly of FIG. 1 with an electrical-to-optical and optical-to-electrical converter module partially withdrawn from the housing.
Figure 4:
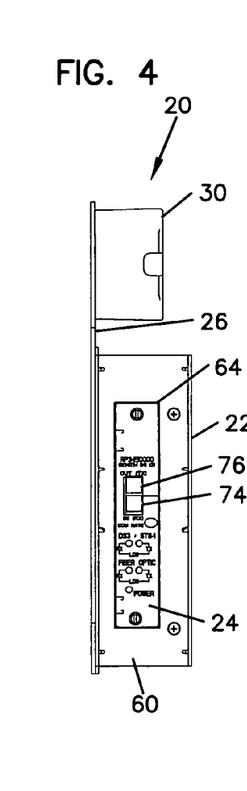
FIG. 4 is a left end view of the mounting assembly of FIG. 3.

Referring to FIGS. 1, 2 and 4, the housing 22 includes an optical interface end 60 positioned opposite from an electrical interface end 62. The optical interface end 60 defines an opening 64 for allowing the converter module 24 to be inserted into or removed from the housing 22. The converter module 24 includes an IN fiber optic connector 74 and an OUT fiber optic connector 76. When the converter module 24 is mounted within the housing, the IN fiber optic connecter 74 and the OUT fiber optic connector 76 are accessible from the optical interface end 60 of the housing 22.

Figure 3:
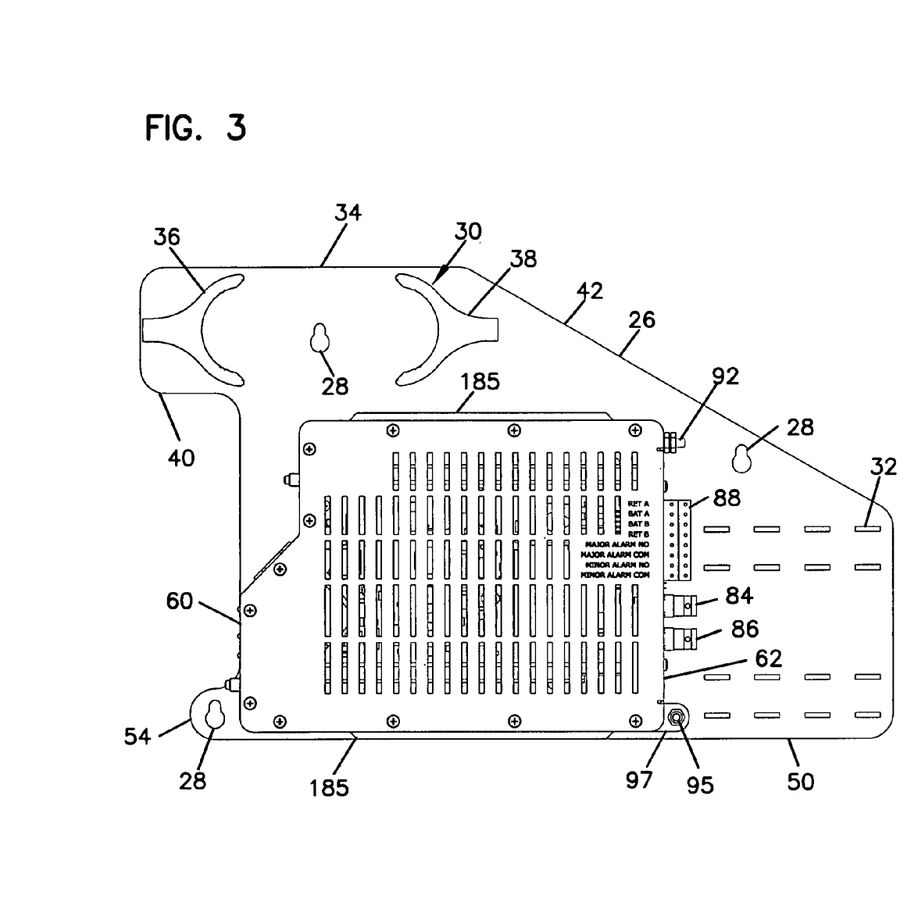
FIG. 3 is a front view of the mounting assembly of FIG. 1.
Figure 5:
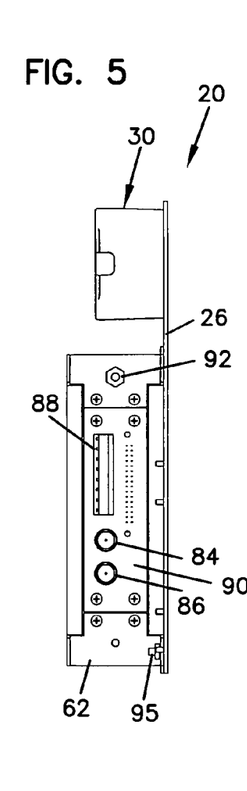
FIG. 5 is a right end view of the housing assembly of FIG. 3.

Referring to FIGS. 3 and 5, the electrical interface end 62 of the housing 22 includes an electrical interface assembly having an IN coaxial connector 84 and an OUT coaxial connector 86. The electrical interface assembly also includes a connector 88 having power/battery contacts and alarm contacts. The connectors 84, 86 and 88 are mounted on a printed circuit board 90 that electrically connects the connectors 84, 86 and 88 to a multi-pin connector 93 (partially shown in FIG. 8E) mounted at the inner side of the printed circuit board 90. When the converter module 24 is inserted within the housing 22, the converter module 24 electrically interconnects with the connector 88 such that an electrical interface is provided between the converter module 24 and the connectors 82, 84 and 86. The electrical interface end 60 also includes a grounding stud 92 for electrically grounding the housing 22. A second grounding stud 95 (shown in FIGS. 3 and 5) electronically connects the adapter plate 26 to the housing 22. The grounding stud 95 connects to ear 97 of the housing 22.

In use, electrical signals are input to the converter module 24 through the IN coaxial connector 84. Within the converter module 24, the electrical signals are converted into optical signals. The optical signals are output from the converter module 24 through the OUT fiber optic connector 76. Similarly, optical signals are input into the converter module 24 through the IN fiber optic connector 74. Within the converter module 24, the optical signals are converted to electrical signals. The electrical signals are output from the converter module 24 through the OUT coaxial connector 86. Voltage for powering the converter module 24 is provided by a power source wired through the power contacts of the connector 88. The converter module also preferably includes circuitry for detecting various types of alarm conditions. If an alarm condition is detected, an alarm signal is sent from the module 24 to downstream equipment that is wired to the alarm contacts of the connector 88.

II. Adapter Plate

As shown in FIG. 3, the adapter plate 26 includes an upper portion 34 that projects above the housing 22. The fiber spool 30 is mounted on the upper portion 34. The fiber spool 30 includes a first half spool 36 spaced laterally from a second half spool 38. The first half spool 36 is mounted on a laterally projecting ear 40 defined by the upper portion 34. The second half spool 38 is mounted adjacent to an inclined top edge 42 of the adapter plate 26. One of the fastener openings 28 is mounted between the two half spools 36 and 38.

The half spools 36 and 38 preferably each have a radius that is greater than a minimum bend radius for fiber optic cable. For example, the half spools 36 and 38 preferably each have a radius greater than 10 times the outer diameter of the largest fiber optic cable intended to be stored. In one non-limiting embodiment, each spool has a radius of about ¾ inch. The half spools 36 and 38 promote effective cable management by allowing for the efficient storage of fiber optic cable. For example, cables connected to the IN and OUT fiber optic connectors 74 and 76 can be routed upwardly from the connectors 74 and 76 and wrapped around the half spools 36 and 38 to store excess cable without causing the cables to be excessively bent.

The adapter plate 26 also includes an extension 50 that projects laterally outwardly beyond the electrical interface end 62 of the housing 22. The tie-down lances 32 are provided on the extension 50 so as to be in generally close proximity to the connectors 84, 86 and 88 of the electrical interface end 62 of the housing 22. Thus, coaxial cables connected to the IN and OUT coaxial connectors 84 and 86 can be tied down to the extension 50 to promote cable management. Cable management can also be enhanced by tying down wires connected to the contacts of the connector 88.

Referring still to FIG. 3, the inclined top edge 42 of the adapter plate 26 defines the upper boundary of the extension 50. One of the fastener openings 28 is defined through the extension 50 at a location above the tie down lances 32.

The adapter plate 26 further includes a lower ear 54 that projects laterally outwardly from the optical interface end 60 of the housing 22. The lower ear 54 defines another one of the fastener openings 28 of the adapter plate 26.

III. Converter Module

Figure 6:
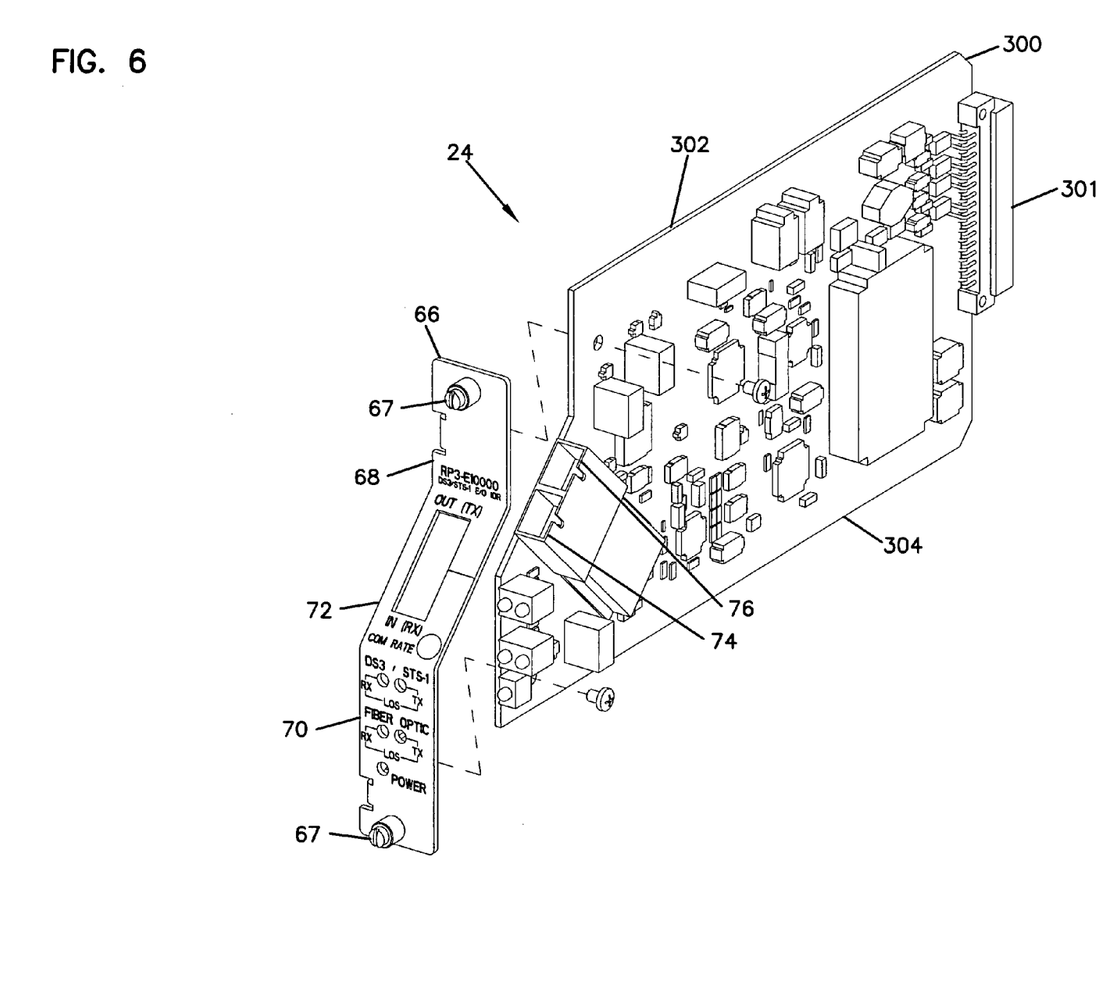
FIG. 6 is a partially exploded, perspective view of an electrical-to-optical and optical-to-electrical converter module that corresponds to the mounting assembly of FIG. 1.

FIG. 6 shows the converter module 24 in isolation from the housing 22. The converter module 24 includes a printed circuit board 300 having upper and lower edges 302 and 304 adapted to fit within upper and lower tracks 106 (shown in FIG. 8A) of the housing 22. A contoured faceplate 66 is mounted at one end of the printed circuit board 300. A connector 301 for interconnecting with the connector 93 of the electrical interface assembly of the housing 22 is provided at an opposite end of the circuit board 300. The faceplate 66 includes an upper in-set portion 68 that is connected to a lower out-set portion 70 by an inclined step 72. The IN and OUT fiber optic connectors 74 and 76 of the module 24 are mounted at the inclined step 72 of the faceplate 66. When the converter module 24 is mounted within the housing 22, the faceplate 66 fits within the opening 64 defined by the fiber optic interface end 60 of the housing 22. As so mounted, the IN and OUT connectors 74 and 76 are angled to face upwardly toward the first half spool 36 of the fiber spool 30 (see FIG. 1).

The fiber optic interface end 60 of the housing 22 is preferably contoured to match the shape the faceplate 66. In this manner, the faceplate 66 mounts flush with the housing 22. The faceplate 66 includes fasteners 67 for securing the converter module 24 to the housing 22.

Referring again to FIG. 6, the module 24 includes circuitry provided on the printed circuit board 300 between the IN and OUT fiber optic connectors 74 and 76 and the connector 301. The circuitry is adapted for converting optical signals to electrical and for converting electrical signals to optical. It will be appreciated that a number of known configurations for achieving this function could be utilized.

Figure 7:
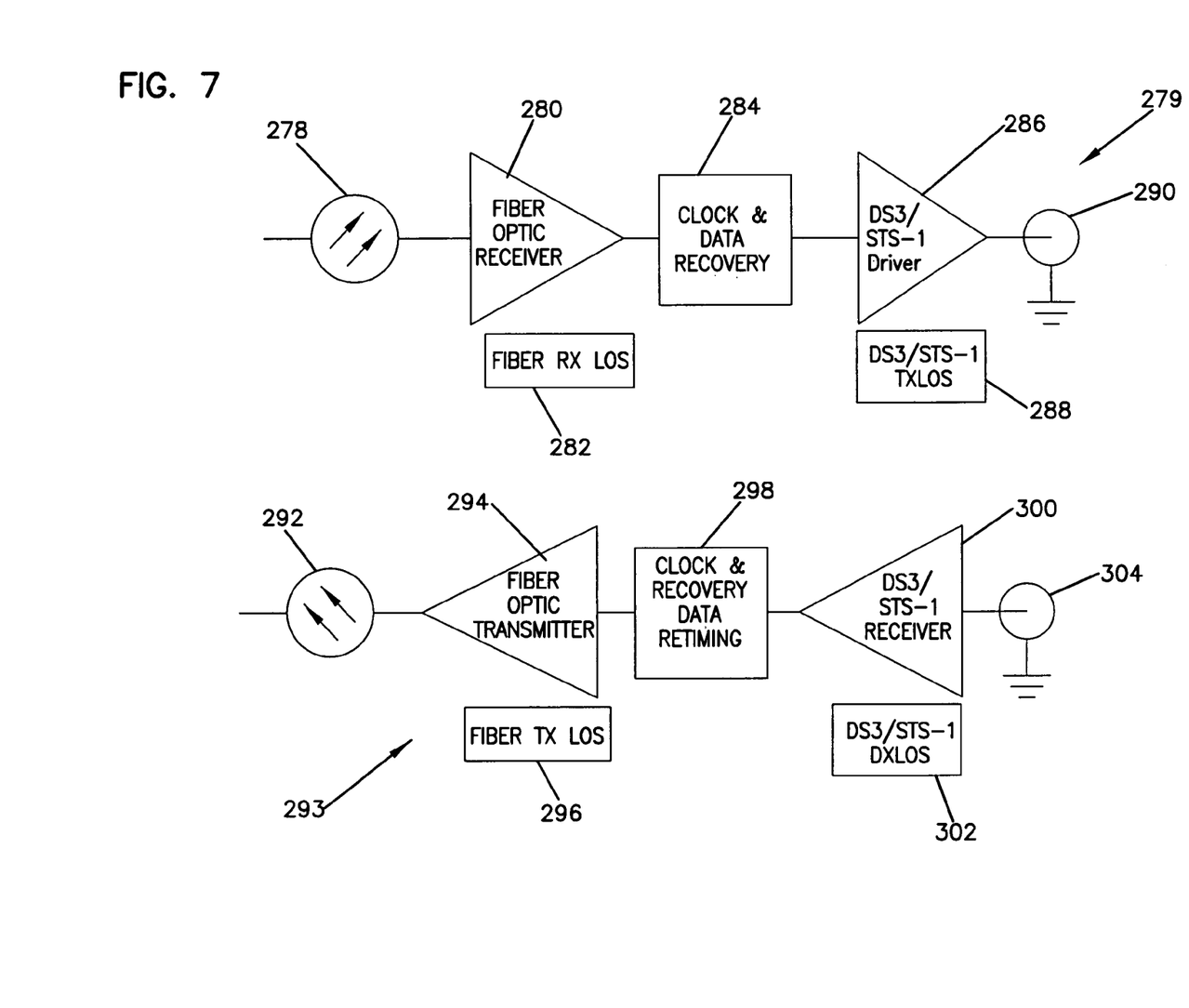
FIG. 7 is a block diagram of representative circuitry for the converter module of FIG. 6.

FIG. 7 shows a high-level block diagram of circuitry such as that contained in module 24 of FIG. 6 for converting electrical signals to optical and optical signals to electrical. The optical signals are received by optical to electrical circuitry 279 through fiber media 278. A fiber optic receiver 280 receives the optical signal and passes it to clock and data recovery circuitry 284. An optical receiver loss-of-signal (LOS) circuit 282 detects the signal level received by the fiber optic receiver 280 to determine whether a signal is present. If not, a minor alarm is generated whereby a visual indicator on the faceplate is triggered and an alarm signal is delivered through the alarm contacts of the connector 88 (shown in FIGS. 3 and 5) to a downstream device.

Clock and data recovery circuit 284 of a given data rate, such as Digital Signal Hierarchy 3 (DS3) (44.736 Mbps) or SONET Synchronous Signal Transfer rate (STS-1) (51.840 Mbps), extracts the clock and data information from a data stream provided by the optical receiver 280. An electrical signal driver 286 of the particular data rate receives the clock and data and reconstructs the electrical signal with the appropriate amplitude and shape before outputting it through an electrical conductor 290. An electrical transmitter LOS circuit 288 detects the signal level output by the driver 286 to determine whether the driver 286 is functioning. If not, a major alarm is generated whereby a visual indicator on the faceplate is triggered and an alarm signal is delivered through the alarm contacts of the connector 88 (shown in FIGS. 3 and 5) to the downstream device.

The electrical signals are received through electrical conductor 304 by the electrical to optical circuitry 293. A receiver circuit 300 of a given data rate recovers the clock and re-times the data prior to sending the signal to the differential driver circuit 298. An electrical receiver LOS circuit 302 detects the signal level received by the receiver circuit 300 to determine whether a signal is present. If not, a minor alarm is generated whereby a visual indicator on the faceplate is triggered and an alarm signal is delivered through the alarm contacts of the connector 88 (shown in FIGS. 3 and 5) to a downstream device.

A differential driver circuit 298 operating at a given data rate then converts the data to a differential signal. A fiber optic transmitter 294 then takes the differential signal and converts it to light pulses delivered to the optical media 292. Optical transmit LOS circuit 296 detects the signal level output by the optic transmitter 294 to determine whether the optic transmitter is functioning. If not, a major alarm is generated whereby a visual indicator on the faceplate is triggered and an alarm signal is delivered through the alarm contacts of the connector 88 (shown in FIGS. 3 and 5) to a downstream device. Additional converter circuitry configurations are disclosed in U.S. patent application Ser. No. 09/873,763, filed on Jun. 4, 2001, which is hereby incorporated by reference.

III. Piece Part and Assembly Description of Housing

Figures 8A, 8B, 8C:
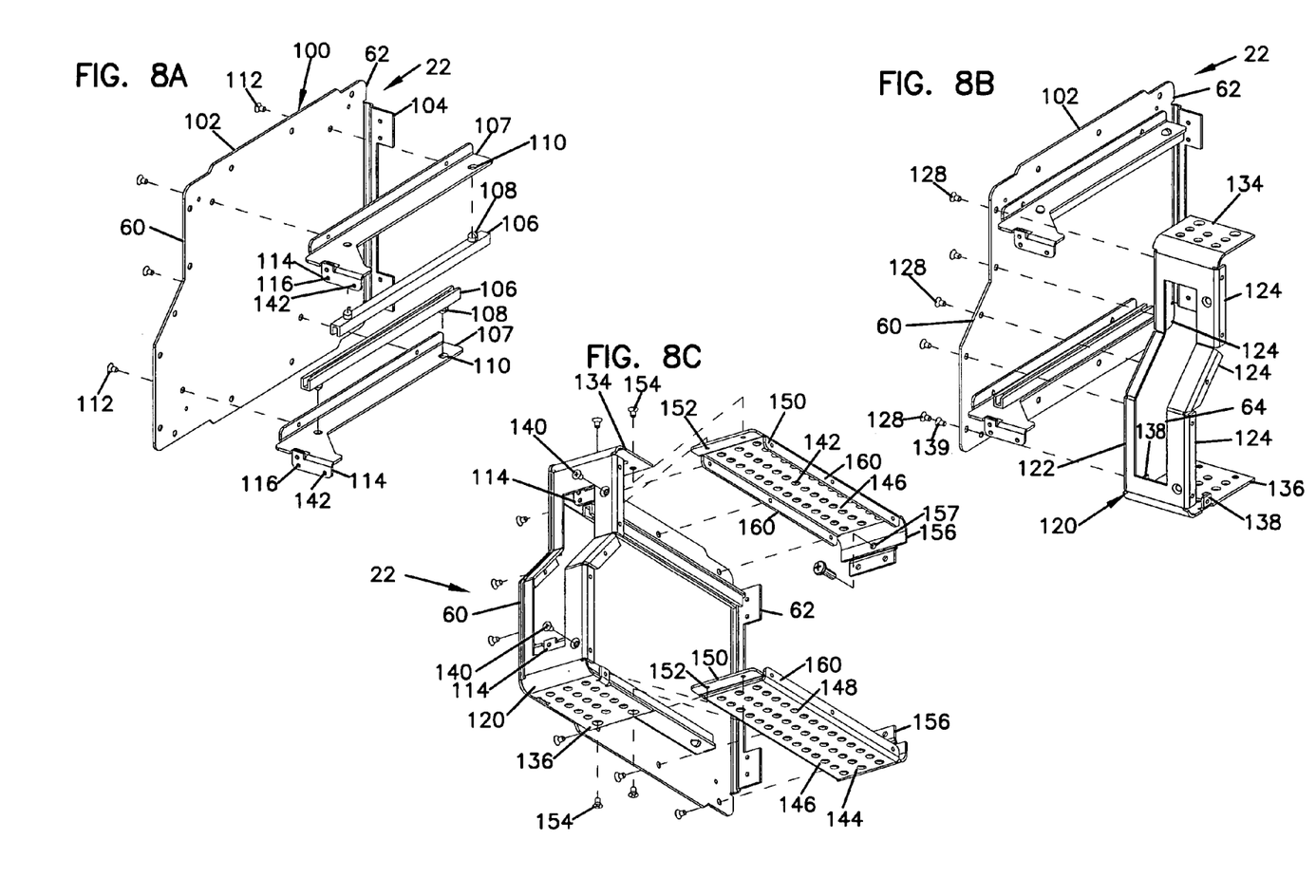
FIGS. 8A–8F show a series of manufacturing steps for assembling the mounting assembly of FIG. 1.

Referring to FIG. 8A, the housing 22 includes a back piece 100 including a planar back plate 102. A flange 104 projects outwardly from the back plate 102 in a generally perpendicular direction. The flange 104 is located adjacent the electrical interface end 62 of the housing 22. The housing 22 also includes upper and lower opposing tracks 106 that are connected to the back plate 102 by track mounting brackets 107. The tracks 106 are connected to the track mounting brackets 107 by a snap-fit connection. For example, snap-fit projections 108 are preferably snapped within openings 110 defined by the track mounting brackets 107. The track mounting brackets 107 are fastened to the back plate 102 by conventional fasteners such as screws 112. When the converter module 24 is inserted within the housing 22, upper and lower edges of the module 24 are received within the tracks 106.

Referring still to FIG. 8A, the track mounting brackets 107 also include tabs 114 that face toward the optical interface end 60 of the housing 22. The tabs 114 define openings 116 that receive the fasteners 67 (shown in FIG. 2) of the converter module 24 to retain the module 24 within the housing 22.

Figure 8D:
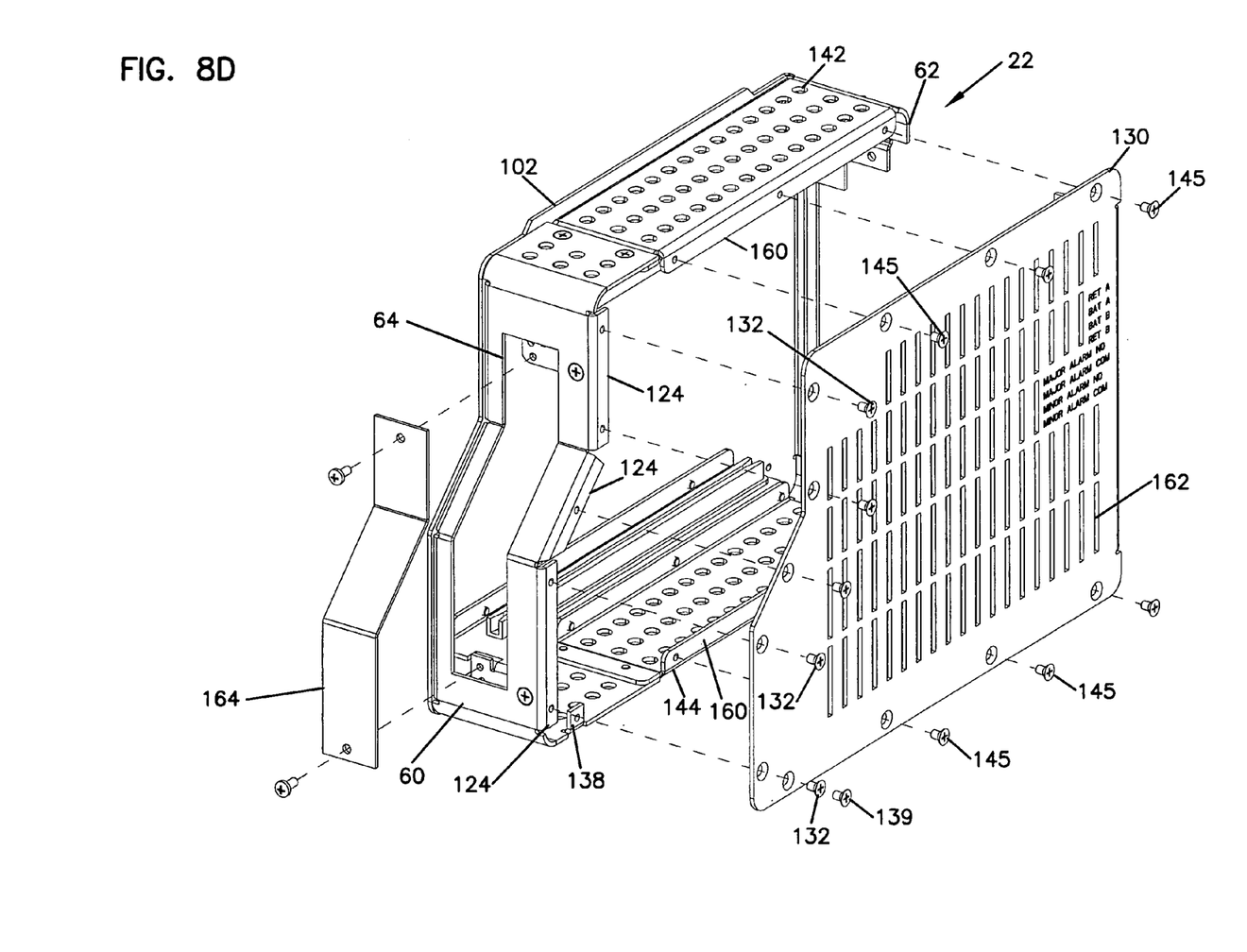

Referring to FIG. 8B, the housing 22 also includes an end piece 120 that mounts at the optical interface end 60 of the housing 22. The end piece 120 includes an end face 122 that defines the opening 64 for receiving the converter module 24. Sets of flanges 124 are located at opposite edges of the end face 122. Referring to FIG. 8B, the left set of flanges 124 (only one of which is visible) is connected to the back plate 102 by fasteners 128. As shown in FIG. 8D, the right set of flanges 124 is connected to a front plate 130 by fasteners 132.

Referring again to FIG. 8B, the end piece 120 also includes upper and lower lateral extensions 134 and 136. Tabs 138 project upwardly from the lower extension 136. The tabs 138 define fastener openings for allowing the tabs 138 to be secured to the back plate 102 and the front plate 130 by fasteners 139 (shown in FIGS. 8B and 8D). The end piece 120 is also connected to the tabs 114 of the track mounting brackets 107 by fasteners 140 (shown in FIG. 8C). The fasteners 140 are preferably threaded within openings 142 (shown in FIG. 8A) defined by the tabs 114.

Referring to FIG. 8C, the housing 22 also includes top and bottom pieces 142 and 144 that preferably have an identical configuration to promote manufacturing efficiency. The top and bottom pieces 142 and 144 each include a primary plate 146 that defines circular ventilation openings 148. Adjacent the optical interface end 60 of the housing 22, the top and bottom pieces 142 and 144 include in-set tabs 150 defining fasteners openings 152. The in-set tabs 150 are secured to the upper and lower extensions 134 and 136 of the end piece 120 by fasteners 154. The in-set configuration of the tabs 150 allows the upper and lower extensions 134 and 136 to mount flush with the primary plates 146 of the top and bottom pieces 142 and 144.

The top and bottom pieces 142 and 144 also include vertical extensions 156 located adjacent to the electrical interface end 62 of the housing 22. A grounding stud 158 is mounted through an opening 157 defined by the top vertical extension 156.

The top and bottom pieces 142 and 144 further include elongated edge flanges 160 defining openings for allowing the top and bottom pieces 142 and 144 to be fastened (e.g., by conventional fasteners such as screws 145 shown in FIGS. 8D and 8E) to the back plate 102 and the front plate 130.

Referring to FIG. 8D, the step of fastening the front plate 130 to the housing 22 is depicted. As previously described, at least portions of the perimeter of the front plate 130 are secured to the other housing components by a plurality of fasteners in the form of screws. For example, fasteners 145 secure the top and bottom ends of the front plate 130 to the edge flanges 160 of the top and bottom pieces 142 and 144. Also, fasteners 132 secure a contoured end of the front plate 130 to the flanges 124 of the end piece 120. It is further noted that the front plate 130 defines a plurality of vertical ventilation slots 162 for ventilating the converter module 24. Additionally, as shown in FIG. 8D, a temporary plate 164 can be used to block the opening 64 at the optical interface end 60 of the housing 22 during transport of the housing 22. When it is desired to mount the converter module 24 within the housing 22, the temporary plate 164 can be removed.

Figure 8E:
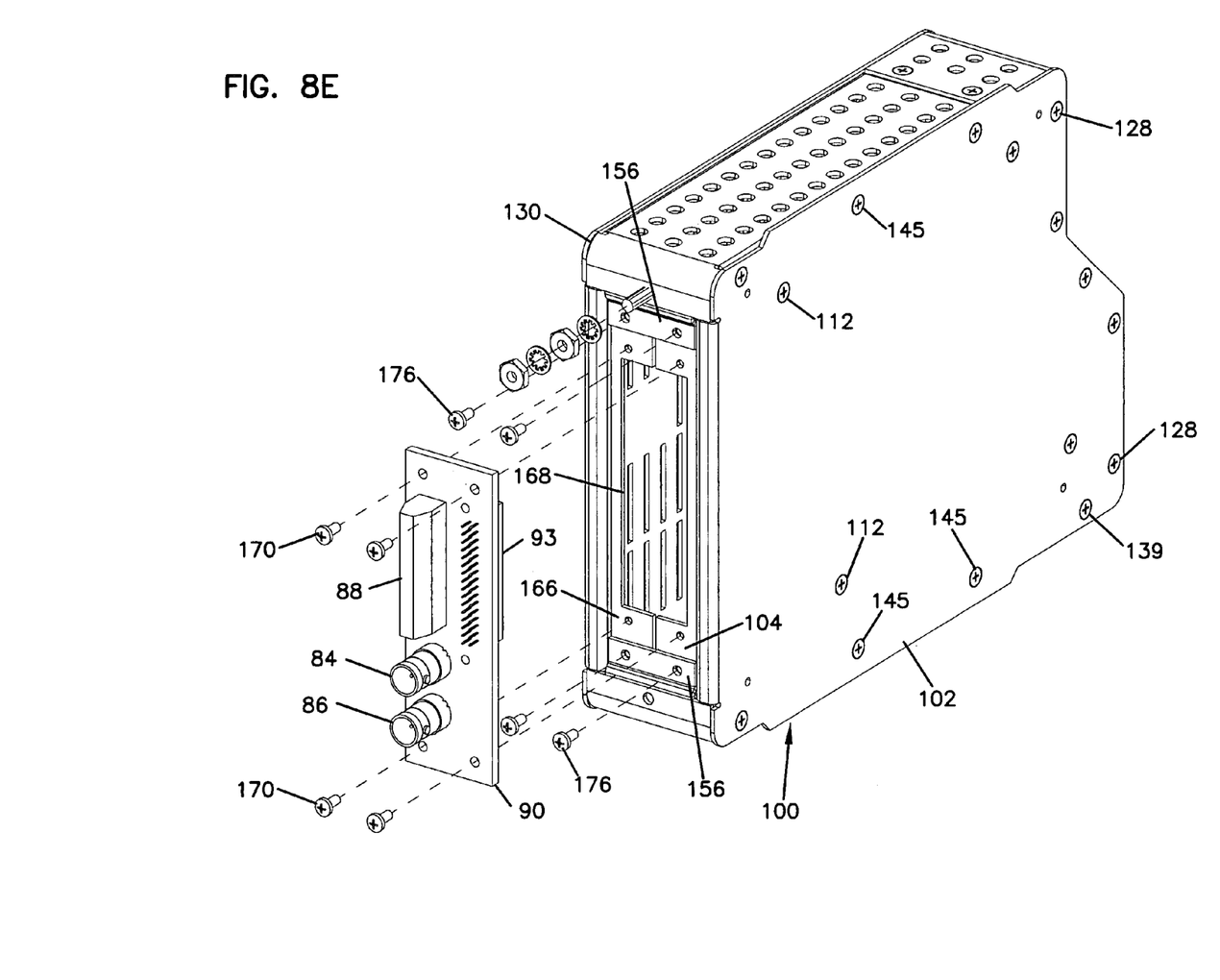

Referring to FIG. 8E, the front plate 130 includes a flange 166 that cooperates with the flange 104 of the back piece 100 to define an opening 168 at the electrical interface and 162 of the housing 22. The opening 168 is covered with the printed circuit board 90 of the electrical interface assembly. The opening 168 allows the connector 93 of the electrical interface assembly to project into the housing 22 to allow for connection with the converter module 24. Shown in FIG. 8E, the printed circuit board 90 is connected to the flanges 104 and 166 by fasteners in the form of screws 170. It is also noted that the flanges 104 and 166 are also connected to the vertical extensions 156 of the top and bottom pieces 142 and 144 by fasteners such as screws 176.

Figure 8F:
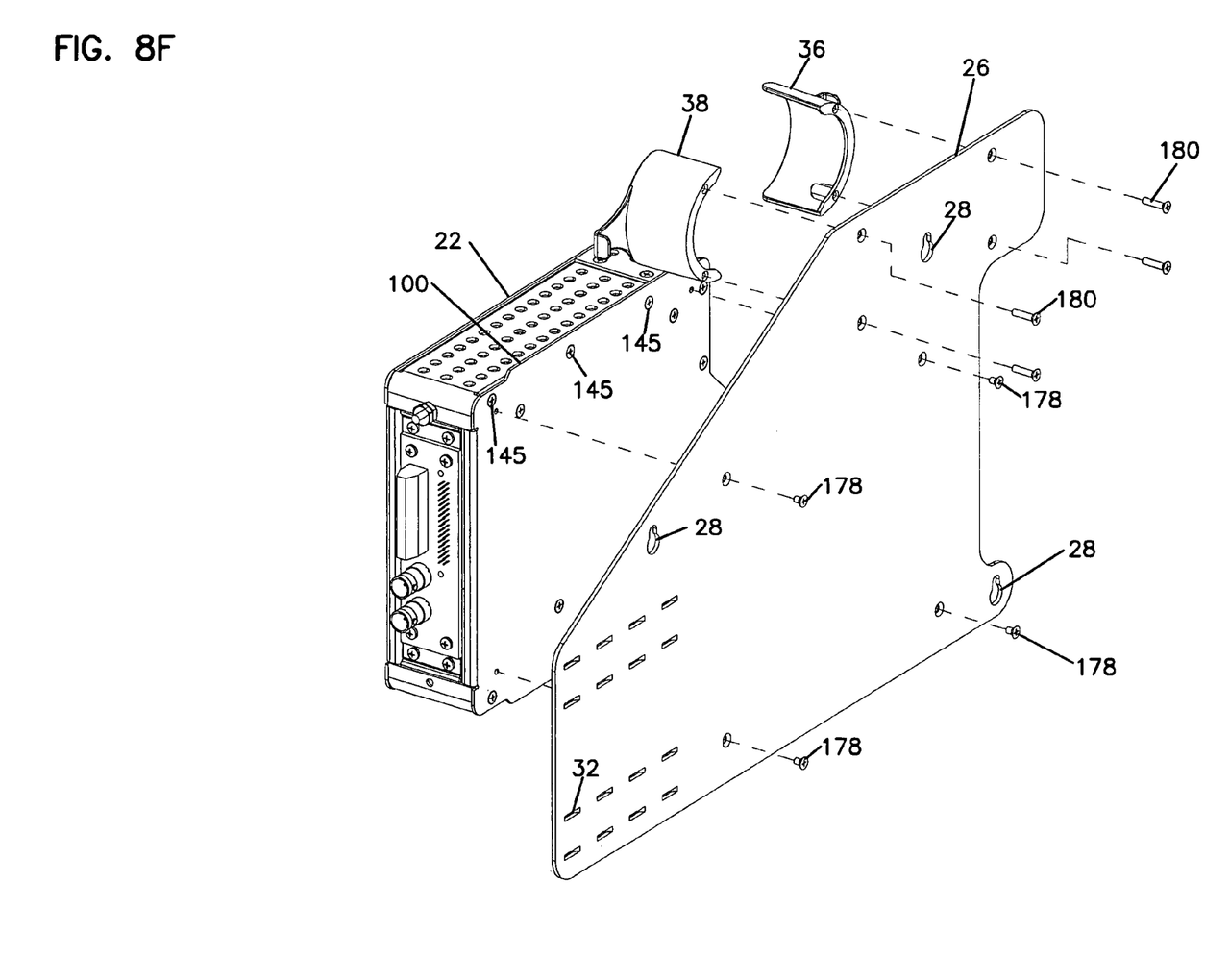

FIG. 8F shows that the adapter plate 26 is connected to the back piece 100 of the housing 22 by fasteners 178. The half spools 36 and 38 are connected to the adapter plate 26 by fasteners 180. The tie-down lances 32 are punched through the adapter plate 26. It is noted that the housing 22 is configured to completely enclose the converter module 24 even when the adapter plate 26 has been removed.

IV. Electromagnetic Shielding

The housing 22 preferably functions to shield the converter module 24 from external electromagnetic interference, and to prevent electromagnetic interference generated by the converter module 24 from interfering with adjacent equipment. To achieve these functions, the housing 22 is preferably made of a material capable of preventing passage of electromagnetic waves. Exemplary types of material include cold-rolled steel or aluminum.

To prevent electromagnetic leakage from the housing, the housing 22 is preferably manufactured with no gaps/spaces having a length greater than the wavelength of the highest frequency generated by the converter module 24. In a preferred embodiment, the vertical ventilation slots 162 have a length less than the wavelength of the highest frequency electromagnetic emission generated by the converter 24, and the ventilation openings 148 have a diameter less than the wavelength of the highest frequency electromagnetic emission generated by the converter 24. In one non-limiting embodiment, the wavelength of the highest frequency emission generated by the converter 24 is about 2.5 inches. Additionally, it is preferred to have direct metal-to-metal contact at the locations where the various pieces of the housing 22 are connected. To achieve this end, the fasteners provided about the perimeter of the front plate 30 and the back plate 102 are placed relatively closely together. For example, the fasteners 145 along the top edges of the back plate 102 and the front plate 130 are preferably positioned within 2.5 inches of one another such that substantial metal-to-metal contact is made between the front and back plates 130 and 102 and the flanges 160 of the top piece 142. The term "substantial metal-to-metal contact" means that there are no breaks in contact having a length greater than the wavelength of the highest frequency wave generated by the converter module 24. Similarly, the fasteners 145 located along the bottom edges of the front and back plates 130 and 102 are preferably positioned within 2.5 inches of one another such that substantial metal-to-metal contact is made between the front and back plates 130 and 102 and the flanges 160 of the bottom piece 144. Also, the fasteners 128, 132 along the edges of optical interface end 60 of the housing are spaced within 2.5 inches of one another such that substantial metal-to-metal contact is made along the flanges 124 of the end piece 120.

Figure 9:
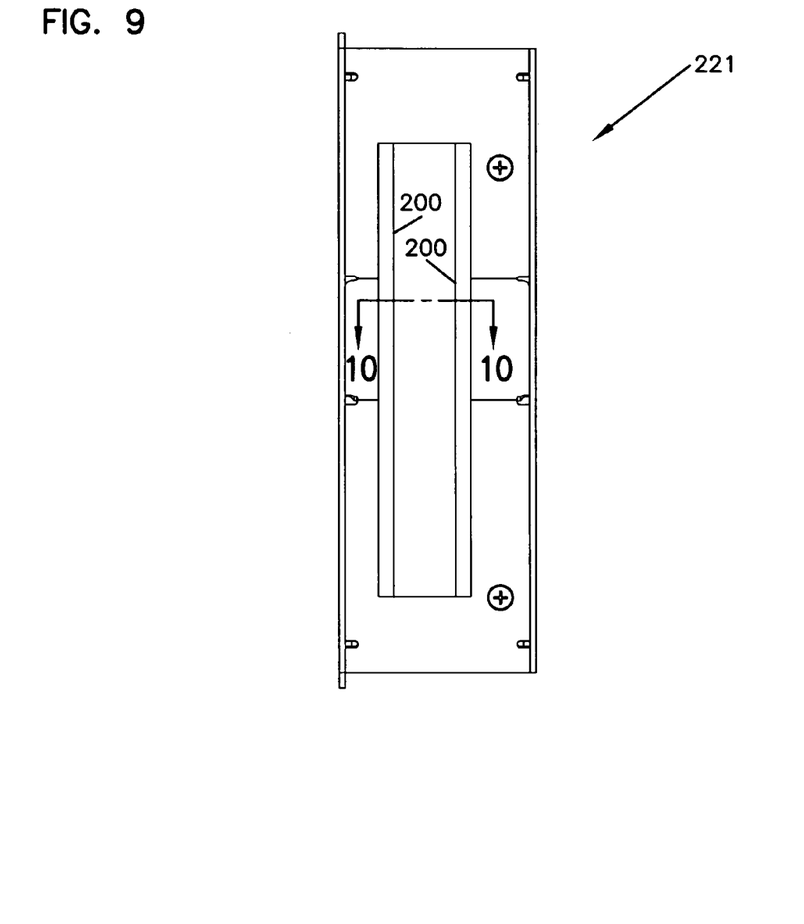
FIG. 9 is a left end view of a converter module housing that is an alternative embodiment of the present invention.
Figure 10:
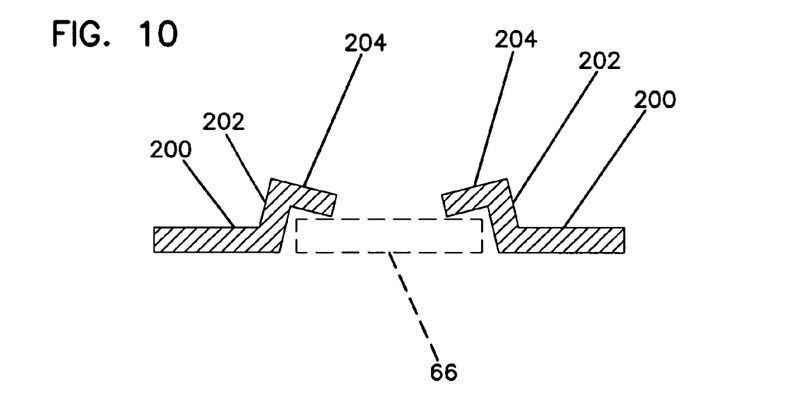
FIG. 10 is a cross-sectional view taken along section line 10—10.

To further prevent electromagnetic energy from escaping the housing 22, the edges of the converter module faceplate 66 are preferably masked when the faceplate 66 is painted such that the edges remain exposed metal. In this manner, metal-to-metal contact is provided between the faceplate 66 and the end face 122 in the region that surrounds the perimeter of the faceplate 66. To enhance metal-to-metal contact along the upright edges of the opening 64, flanges can be integrally formed with the edges. Preferably, the flanges include portions that extend behind the faceplate 66. For example, FIGS. 8 and 9 show a housing 22' including a flange 200 having a rear extension 202 that projects rearwardly into the housing 22', and a tab 204 that projects outwardly from the rear extension 202. The tab 204 can be bent slightly forwardly such that the tab 204 is biased against the backside of the faceplate 66 when the converter module is mounted within the housing 22.

With respect to the electrical interface end 62 of the housing 22, the circuit board 90 preferably includes metal grounding planes that prevent electromagnetic energy from escaping through the circuit board 90.

In one embodiment, the housing meets UL (Underwriter Laboratory) 1950 safety requirements, FCC PAR 68 requirements, and level 3 NEBS (Network Equipment Building System) requirements (e.g., GR63 and GR1089).

V. Chassis Configurations

Figure 11:
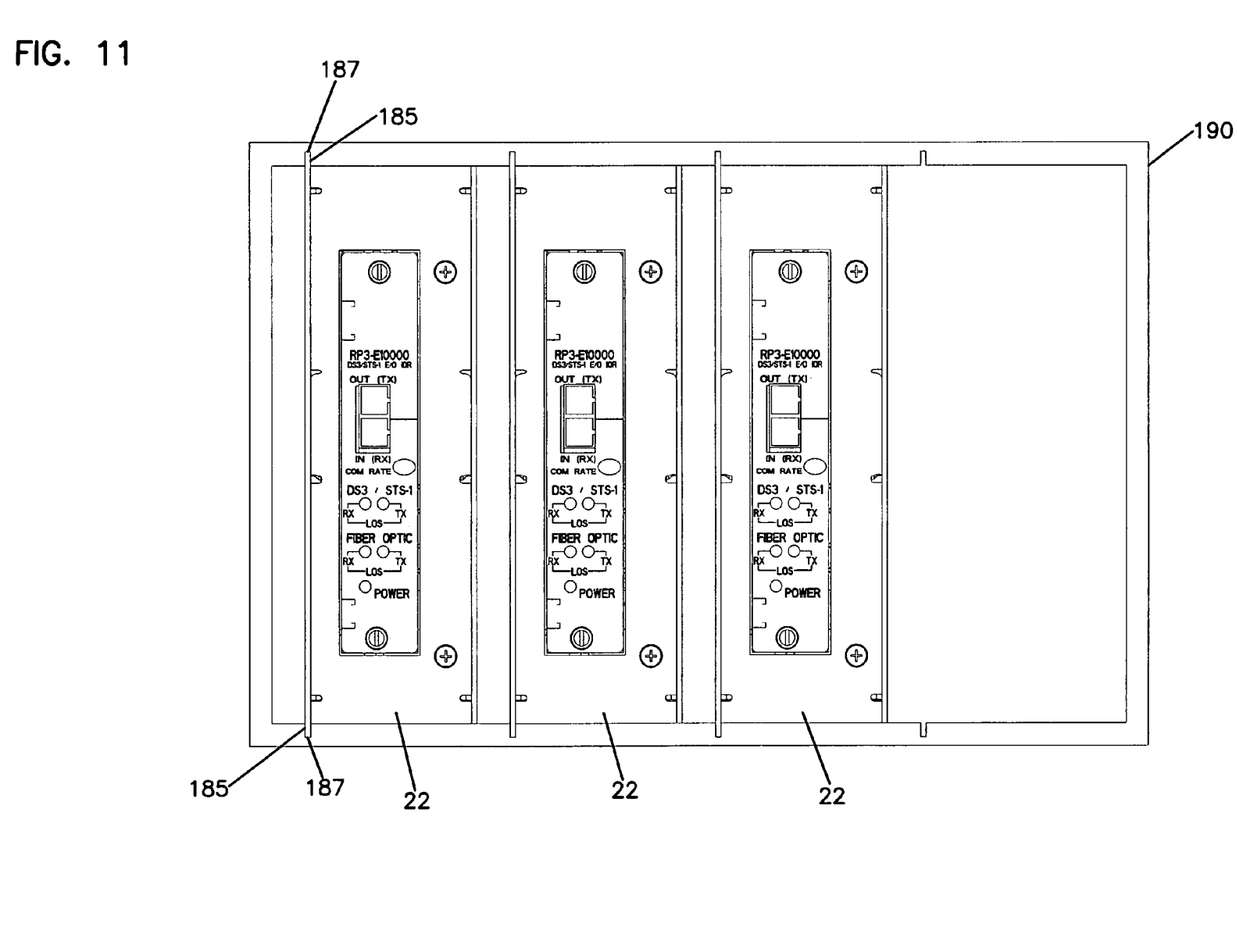
FIG. 11 is a front view of a chassis for holding a plurality of individually removable converter module housings.
Figure 12:
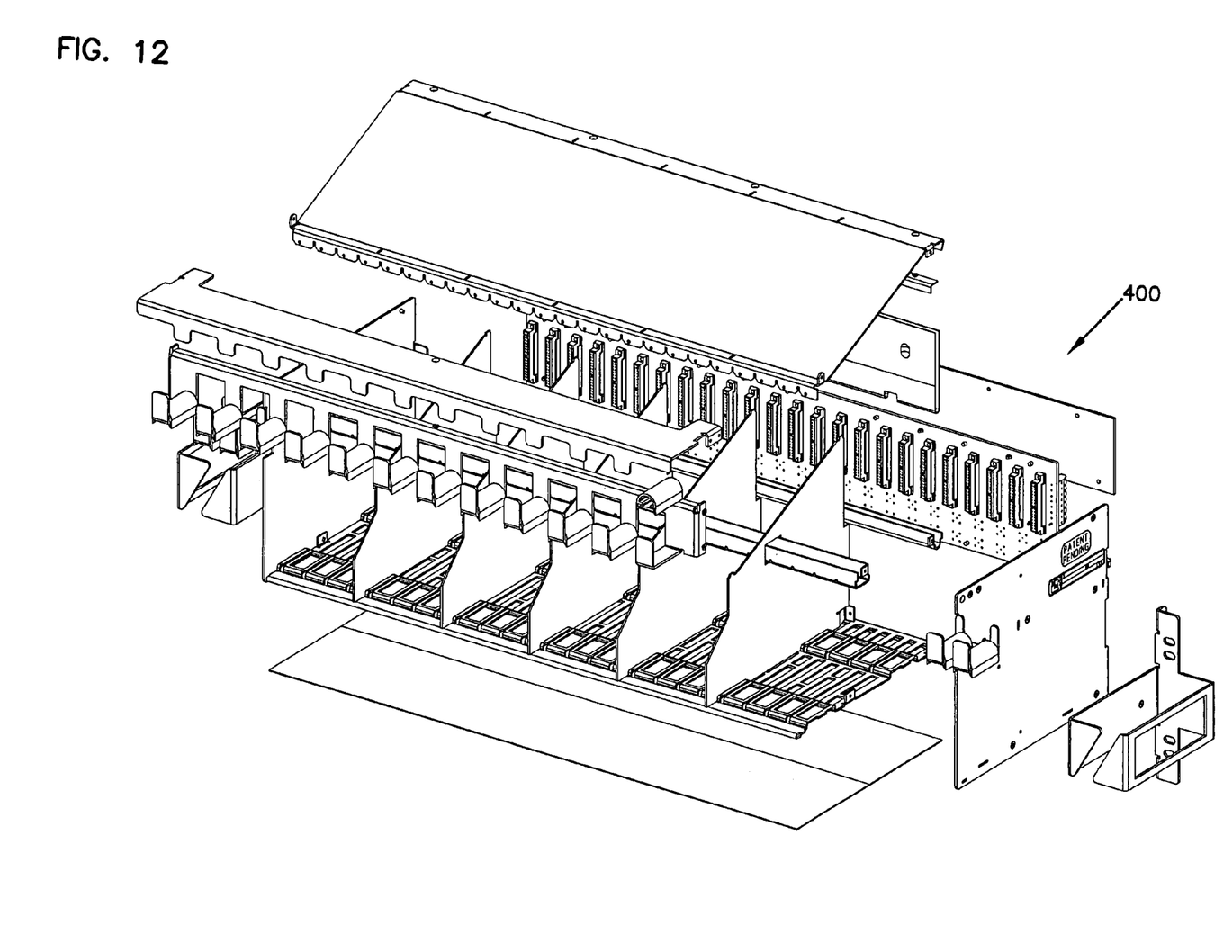
FIG. 12 is a perspective view of a chassis adapted for receiving a plurality of the electrical-to-optical and optical-to-electrical converter modules of FIG. 6.

The wall mount telecommunications equipment mounting assembly 20 shown in FIG. 1 is particularly well suited for small capacity environments such as a customer premises. In certain circumstances, the capacity requirements of a particular environment may increase over time such that additional converter modules 24 are needed to provide enough capacity. If this occurs, it is possible to continue to use the telecommunications equipment mounting assembly 20 by removing the adapter plate 26 from the housing 22. As shown in FIG. 11, the housing 22 can then be mounted within a chassis 190 along with one or more other housings 22. To facilitate mounting the housing 22 within the chassis 190, the housing 22 includes upper and lower rails 185 adapted to fit within tracks 187 provided within the chassis 190.

FIG. 11, shows another chassis 400 adapted for holding a plurality of converter modules 24. It will be appreciated that the same converter modules 24 that mount within the housing 22 can be mounted within the chassis 400. Manufacturing efficiency is enhanced by using the same type of converter module 24 in different types of enclosure configurations (e.g., stand alone housings as well as multi module chassis).

While the inventions have been particularly shown and described with reference to preferred embodiments thereof, it will be understood that by those skilled in the art that various other changes in the form and details may be made therein without departing from the spirit and scope of the invention.

We claim:

1. A telecommunications device comprising:
   a housing including a first end and an opposite second end, the housing adapted to removably receive a telecommunications equipment module, the telecommunications equipment module including an electrical-to-optical and optical-to-electrical signal converter, wherein the signal converter is mounted in the housing and includes fiber optic connectors located at the first end of the housing, and wherein the housing includes coaxial connecters located at the second end of the housing that are electrically connected to the signal converter; and
   an adapter plate removably connected to the housing, the adapter plate including structure for mounting the adapter plate to a wall, wherein the adapter plate includes an upper extension that projects above a top side of the housing, and wherein a cable management spool is mounted on the extension.

2. The telecommunications device of claim 1, wherein the spool includes two spaced apart half-spools.

3. The telecommunications device of claim 2, wherein the signal converter includes a face plate having an inclined portion, wherein the fiber optic connectors are positioned at the inclined portion, and wherein one of the half-spools is located directly above the inclined portion.

4. The telecommunications device of claim 2, wherein a mounting aperture is located between the two half-spools.

5. The telecommunications device of claim 1, wherein the adapter plate includes a side extension that projects outwardly from the second end of the housing, the side extension including tie-down lances.

6. A telecommunications device comprising:
a housing including a top side positioned opposite from a bottom side, and a first end positioned opposite from a second end, the first end defining an opening for allowing a telecommunications module to be inserted into or removed from the housing, the second end including an electrical interface assembly adapted to electrically connect with the telecommunications module when the telecommunications module is mounted within the housing, the electrical interface assembly including electrical connectors that are accessible from the second end of the housing;
a first extension that projects outwardly from the housing, the first extension including a cable management spool;
a second extension that projects outwardly from the housing, the second extension including a tie-down structure; and
the first and second extensions defining openings for receiving fasteners for connecting the telecommunications device to a wall.

7. The telecommunications device of claim 6, wherein the first and second extensions are parts of a single plate connected to the housing.

8. The telecommunications device of claim 6, wherein the first extension projects upwardly from the top side of the housing, and wherein the second extension projects laterally from the second end of the housing.

9. The telecommunications device of claim 8, wherein the first end of the housing includes an in-set wall connected to an out-set wall by an inclined step, and wherein the cable management spool is located directly above the inclined step.

10. The telecommunications device of claim 9, wherein the telecommunications module includes an optical-to-electrical and electrical-to-optical converter, and wherein the converter includes a faceplate that fits within the opening at the first end of the housing, the plate including an in-set portion connected to an out-set portion by an inclined portion, the converter including fiber optic connectors mounted at the inclined portion.

11. A telecommunications device comprising:
a housing including a top side positioned opposite from a bottom side, and a first end positioned opposite from a second end, the first end defining an access opening, the first end also including an in-set wall connected to an out-set wall by an inclined wall, the second end including an electrical interface assembly including:
a circuit board;
an inner connector mounted at an inner side of the circuit board;
IN and OUT co-axial connectors mounted at an outer side of the circuit board;
a power connector mounted at the outer side of the circuit board;
a single set of opposing upper and lower tracks mounted within the housing;
an upper extension that projects above the top side of the housing, the upper extension including a cable management spool located over the inclined wall of the first end of the housing; and
a side extension that projects laterally outwardly from the second end of the housing, the side extension including one or more tie-down structures.

12. The telecommunications device of claim 11, wherein the upper extension and the side extension are part of a plate that includes structure for mounting the housing to a wall.

13. The telecommunications device of claim 11, further comprising an optical-to-electrical and electrical-to-optical converter that mounts within the housing, the converter including a circuit board having top and bottom edges adapted to slide within the upper and lower tracks, the converter including a converter connector that connects with the inner connector when the converter is mounted within the housing, the converter also including a faceplate for blocking the access opening, the faceplate including an in-set portion connected to an out-set portion by an inclined portion at which IN and OUT optical connectors are located.

* * * * *